United States Patent
Evans et al.

(10) Patent No.: US 6,627,510 B1
(45) Date of Patent: Sep. 30, 2003

(54) METHOD OF MAKING SELF-ALIGNED SHALLOW TRENCH ISOLATION

(75) Inventors: David R. Evans, Beaverton, OR (US); Sheng Teng Hsu, Camas, WA (US); Bruce D. Ulrich, Beaverton, OR (US); Douglas J. Tweet, Camas, WA (US); Lisa H. Stecker, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 48 days.

(21) Appl. No.: 10/112,014

(22) Filed: Mar. 29, 2002

(51) Int. Cl.⁷ .................. H01L 21/762; H01L 23/544
(52) U.S. Cl. ............................. 438/401; 438/975
(58) Field of Search ................. 438/401, 975, 438/FOR 435; 257/797, E23.179

(56) References Cited

U.S. PATENT DOCUMENTS

| | | | | |
|---|---|---|---|---|
| 5,369,050 A | * | 11/1994 | Kawai | 438/401 |
| 5,733,801 A | * | 3/1998 | Gojohbori | 438/401 |
| 6,146,975 A | * | 11/2000 | Kuehne et al. | 438/437 |
| 6,391,745 B1 | * | 5/2002 | Kwon | 438/462 |
| 6,566,157 B2 | * | 5/2003 | Ohtaka | 438/48 |
| 2001/0036738 A1 | * | 11/2001 | Hatanaka et al. | 438/693 |
| 2003/0119274 | * | 6/2003 | Weis | 438/401 |

FOREIGN PATENT DOCUMENTS

KR    2001004309 A  *  1/2001  ......... H01L/21/304

* cited by examiner

*Primary Examiner*—George Fourson
(74) *Attorney, Agent, or Firm*—Matthew D. Rabdau; David C. Ripma; Scott C. Krieger

(57) ABSTRACT

A modified STI process is provided comprising forming a first polysilicon layer over a substrate. Forming a trench through the first polysilicon layer and into the substrate, and filling the trench with an oxide layer. Depositing a second polysilicon layer over the oxide, such that the bottom of the second polysilicon layer within the trench is above the bottom of the first polysilicon layer, and the top of the second polysilicon layer within the trench is below the top of the first polysilicon layer. The resulting structure may then be planarized using a CMP process. An alignment key may be formed by selectively etching the oxide layer. A third polysilicon layer may then be deposited and patterned using photoresist to form a gate structure. During patterning, exposed second polysilicon layer is etched. An etch stop is detected at the completion of removal of the second polysilicon layer. A thin layer of the first polysilicon layer remains, to be carefully removed using a subsequent selective etch process.

12 Claims, 4 Drawing Sheets

METHOD OF MAKING SELF-ALIGNED SHALLOW TRENCH ISOLATION

BACKGROUND OF THE INVENTION

The present invention relates to semiconductor processes, and more particularly to methods of isolating device structures.

Several methods of isolating adjacent device structures, for example transistors, on a semiconductor substrate have been used. One process that has been used since the 1970s is local oxidation of silicon, commonly referred to as LOCOS. LOCOS is a locally selective oxidation isolation process. One of the limitations of the LOCOS process is due to lateral oxidation under a nitride mask used to define the isolation region, resulting in a characteristic "bird's beak" shape. The bird's beak reduces the effective channel width of the device and causes threshold voltage non-uniformity within the transistors to be formed. The LOCOS process also has the limitations of defect generation, segregation of doping in the field region, as well as other limitations known to those of ordinary skill in the art. For example, defects can be generated around the perimeter of the device. The segregation of boron into field oxide causes a reduction of field threshold voltage and increased field leakage current. In the worst case, devices can become electrically connected through the field region.

Another method of isolation is direct shallow trench isolation, also known as direct STI. This is a simple shallow trench isolation process. Trenches are etched in a silicon substrate through either an oxide or a nitride mask. The resulting trench is then refilled with silicon dioxide and planarized using a chemical mechanical polishing (CMP) process. A disadvantage of this process is that corners of the trenches must be rounded to prevent the formation of a parasitic edge transistor, gate oxide breakdown at the edge of the active regions, or both. Consequently, this process also causes channel width reduction and threshold voltage non-uniformity.

A modified STI process has also been used. Gate oxide is grown and a first polysilicon layer is deposited after well formation. Silicon trenches are etched through the gate oxide and the first polysilicon layer. The trenches are then refilled with oxide followed by a second polysilicon layer. The first polysilicon and the second polysilicon layer are both used to form at least a portion of the polysilicon gate electrode. The main drawback of this process is post-polish thickness control of the first polysilicon layer, which causes difficulty with end point detection of the gate polysilicon etch.

The various STI processes provide a flat surface, which makes lithographic patterning easier. However, there are no inherent alignment marks, so additional photoresist mask steps must be used to etch an alignment key

SUMMARY OF THE INVENTION

Accordingly, a modified STI process is provided comprising forming a first polysilicon layer over a substrate. Forming a trench through the first polysilicon layer and into the substrate, and filling the trench with an oxide layer. Depositing a second polysilicon layer over the oxide, such that the bottom of the second polysilicon layer within the trench is above the bottom of the first polysilicon layer, and the top of the second polysilicon layer within the trench is below the top of the first polysilicon layer. The resulting structure may then be planarized using a CMP process. An alignment key may be formed by selectively etching the oxide layer. A third polysilicon layer may then be deposited and patterned using photoresist to form a gate structure. During patterning, exposed second polysilicon layer is etched. An etch stop is detected at the completion of removal of the second polysilicon layer. A thin layer of the first polysilicon layer remains, to be carefully removed using a subsequent selective etch process.

DETAILED DESCRIPTION OF THE INVENTION

Figure 1:
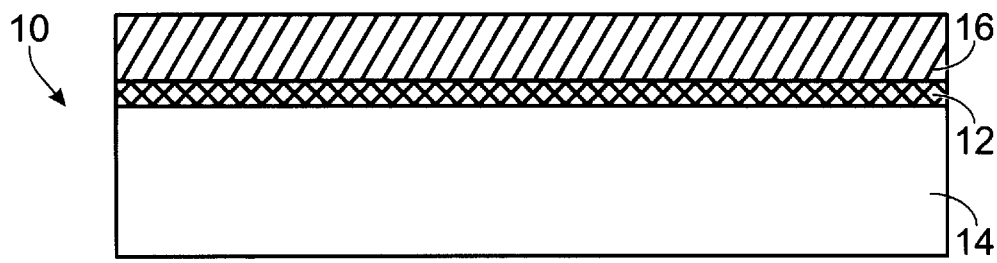
FIG. 1 is cross section view of a device structure during processing.

For the present method, a semiconductor substrate is provided. An n-well or a p-well may be formed if desired prior to isolating adjacent device areas. Referring now to FIG. 1, a device structure 10 is formed by growing, or growing and depositing a gate insulator 12 overlying a semiconductor substrate 14 and depositing a first polysilicon layer 16, which may also be referred to as poly 1 throughout this description, overlying the gate insulator 12, following formation of n-wells or p-wells, if any. The thickness of poly 1 is referred to as $T_{p1}$. In another embodiment, which is suitable to a sacrificial gate process, a silicon nitride layer replaces the poly1 overlying the gate insulator 12. Also the gate insulator 12, may comprise silicon oxide, or a high-k material, such as silicon oxynitride, hafnium oxide, zirconium oxide, lanthanum oxide or other suitable gate dielectric material.

Figure 2:
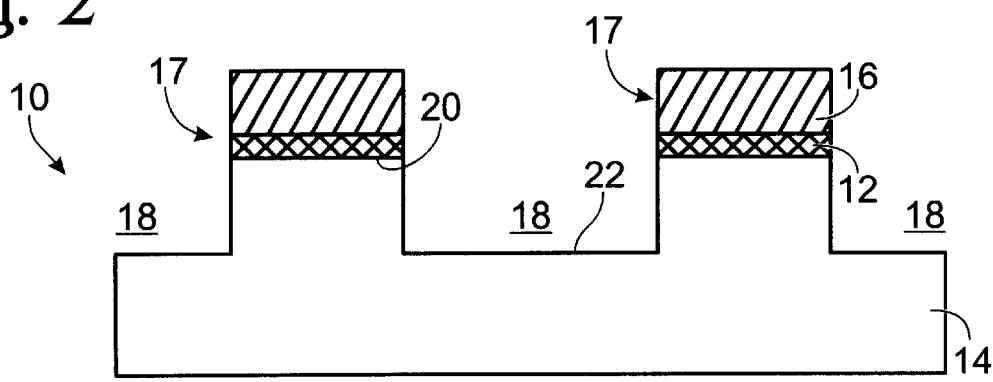
FIG. 2 is cross section view of a device structure during processing.

FIG. 2 shows a cross-section of the device structure 10 comprising two adjacent device regions 17 following etching of the semiconductor substrate 14 to form trenches 18. The depth of the trenches 18, which is referred to as $X_{STI}$, extends from the top of the substrate surface 20 to the bottom 22 of the trenches 18 to achieve surface planarity following subsequent polishing. The uncertainty, or variation, in the trench depth is referred to as $\Delta X_{STI}$. Following etching of the substrate, a cleaning may be performed to reduce, or eliminate, etch damage.

Figure 3:
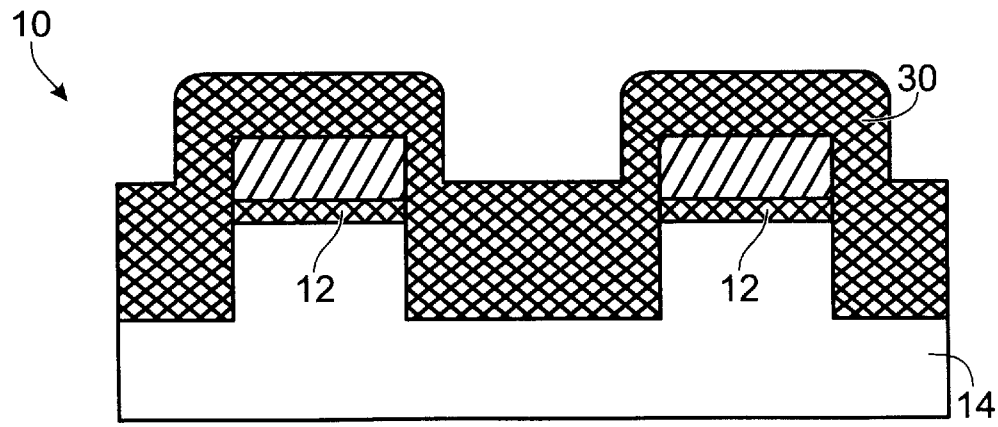
FIG. 3 is cross section view of a device structure during processing.

FIG. 3 shows the device structure 10 following the deposition of an oxide layer 30. The oxide layer 30 is deposited to refill the trenches 18 with oxide. The oxide layer 30 has a minimum thickness that is greater than the maximum possible depth of the trench. Referring to the oxide thickness as $T_{OX}$, and the uncertainty, or variation, in oxide thickness as $\Delta T_{OX}$, the oxide layer 30 should be deposited and processed so that the final processed thickness satisfies the condition that:

$$T_{OX} - \Delta T_{OX} > X_{STI} + \Delta X_{STI}$$

The oxide may comprise a thin thermal oxide to provide a good interface between the oxide and silicon in the field followed by a deposited oxide. The deposited oxide can be formed by a variety of methods including chemical vapor deposition (CVD) methods, such as, LTO, HPCVD, PECVD, or other CVD methods. Non-CVD methods such as sputtering may also be used. Following deposition of oxide by any suitable method, the oxide may then be densified at a higher temperature, if necessary or desired.

Figure 4:
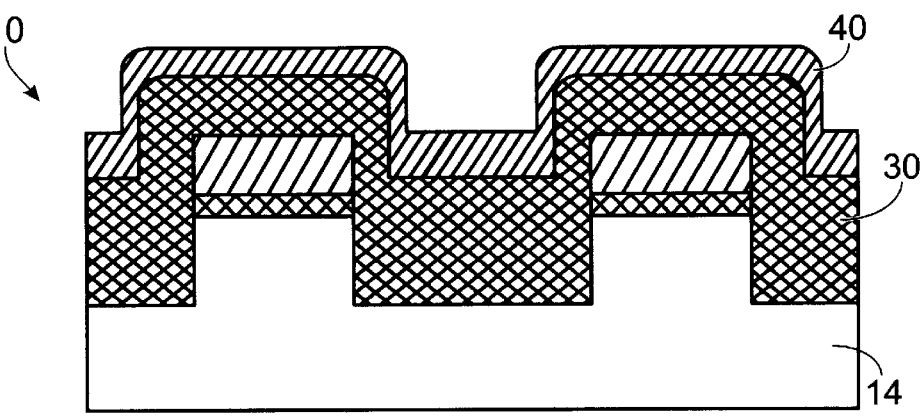
FIG. 4 is cross section view of a device structure during processing.

As shown in FIG. 4, a second polysilicon layer 40, also referred to herein as poly 2, or field poly, is deposited overlying a device structure 10. The thickness of poly 2 is referred to as $T_{p2}$. Poly 2 should have a thickness selected such that the maximum thickness of poly 2 plus the maximum thickness of oxide is thinner than the minimum depth of the trench plus the minimum thickness of poly 1. Accordingly, the thickness of poly 2 should satisfy the condition:

$$T_{p2} + \Delta T_{p2} + T_{OX} + \Delta T_{OX} < X_{STI} - \Delta X_{STI} + T_{p1} - \Delta T_{p1}$$

To satisfy this condition and still have a meaningful thickness of poly 2, there is a maximum desired oxide thickness. The maximum oxide thickness should satisfy the condition:

$$T_{OX} + \Delta T_{OX} < X_{STI} - \Delta X_{STI} + T_{p1} - \Delta T_{p1} - T_{p2} - \Delta T_{p2}$$

This should result in the top level of the oxide within the trench being above the bottom level of poly 1, and the top level of poly 2 within the trench being below the top level of poly 1.

After poly 2 is deposited, a sacrificial oxide layer, not shown, is deposited overlying the device structure 10. The sacrificial oxide layer may be, for example, undensified TEOS. In one embodiment the sacrificial oxide layer is one and a half times thicker than the maximum thickness of poly 1. In another embodiment, the sacrificial oxide layer should have a thickness such that the combined thickness of the gate insulator 12, poly 1, the oxide layer 30, poly 2, and the sacrificial oxide layer is approximately two times the total step height of the active area features, which corresponds to the actual physical relief of the top surfaces.

Figure 5:
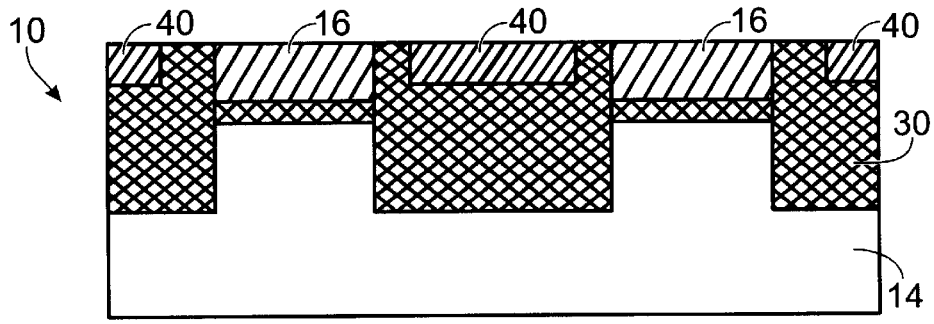
FIG. 5 is cross section view of a device structure during processing.

Next, as shown in FIG. 5, the device structure 10 is polished using CMP to polish the oxide layer 30 and stop at the top of the second polysilicon layer 40 in the field region. This may be achieved using a two step process. In the first step, a non-selective slurry is used to remove the overlying oxide and the portion of the second polysilicon layer 40 overlying active areas within the device regions. The second step utilizes a selective polish, which continues to remove oxide and stops at the first polysilicon layer 16 in the active areas and at the second polysilicon layer 40 in the field regions. The actual field oxide is not polished in this step. During the selective polish the active areas are much smaller than the field areas and the polish rate of oxide can be selected to be sufficiently higher than that of polysilicon, for example greater than 5:1 oxide to polysilicon etch ratio, so this CMP process can be readily achieved. Since, $$T_{p2} + \Delta T_{p2} + T_{OX} + \Delta T_{OX} < X_{STI} - \Delta X_{STI} + T_{p1} - \Delta T_{p1}$$

the oxide on poly 1 is completely removed before the CMP stop at the field poly 2. By using the top of poly 2 as the CMP stop, global planarization may be achieved without using a reverse mask photoresist and etching process.

At this point, it would be possible to continue with processing as described below in detail. Alternatively, if a sacrificial gate process were used any sacrificial gate material, would be removed. The sacrificial gate material could be polysilicon, silicon nitride or other suitable sacrificial gate material. The underlying gate insulator may also be removed if desired. A replacement gate insulator, for example a high-k gate insulator, may be formed. A replacement gate process could then be completed.

Figure 6:
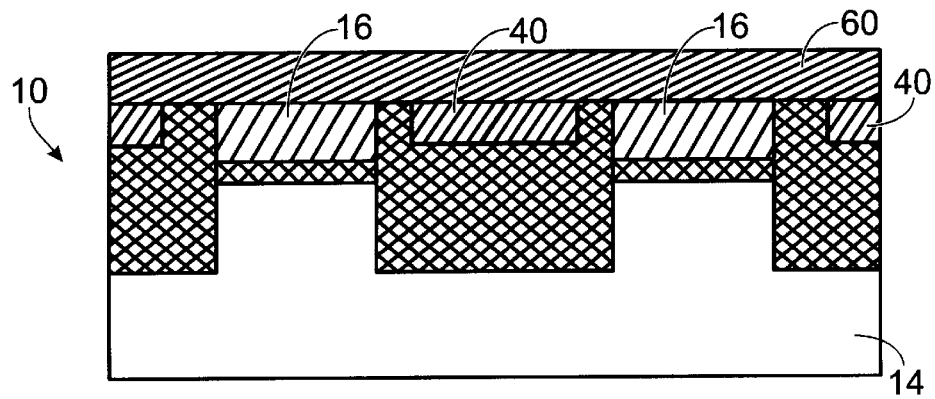
FIG. 6 is cross section view of a device structure during processing.

As shown in FIG. 6, a third polysilicon layer 60, also referred to herein as poly 3, is deposited overlying the device structure 10 following CMP. The actual gate polysilicon thickness will correspond to the sum of the poly 3 thickness plus the thickness of poly 1 that remains after CMP.

Figure 7:
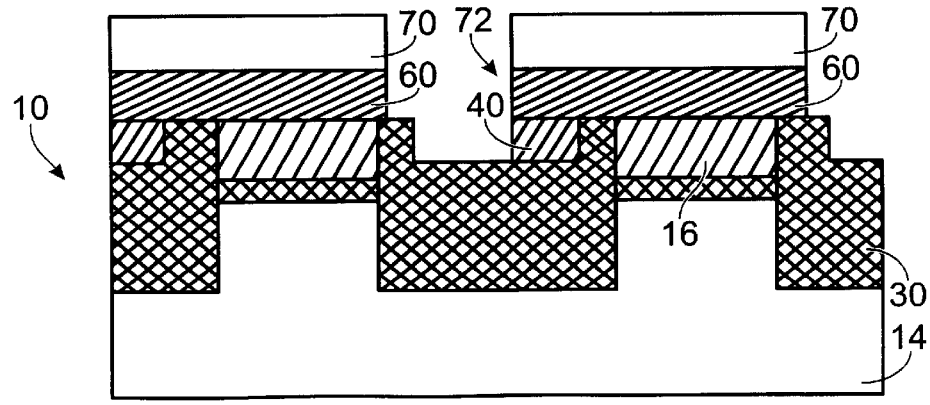
FIG. 7 is cross section view of a device structure during processing.
Figure 8:
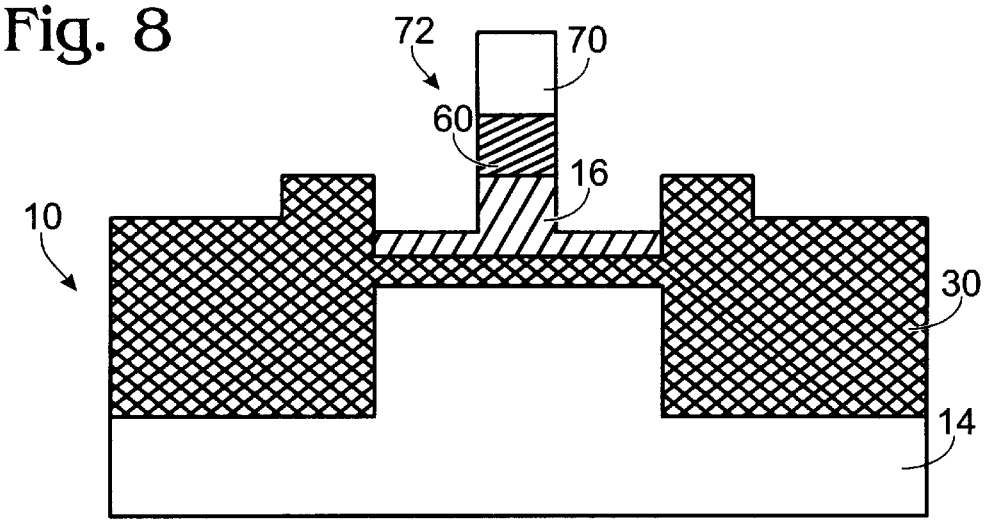
FIG. 8 is cross section view of a device structure as in FIG. 7, but rotated ninety degrees to show the source, channel, and drain regions.

Referring now to FIG. 7, photoresist 70 is applied and patterned to define a polysilicon gate structure 72. A two step plasma etch process may be used to etch the poly 3/poly 1 stack and the poly 3/poly 2 stack. The first step has a high polysilicon etch rate and stops at the end point, which corresponds to the point at which exposed poly 2 has been completely removed. Notice that some poly 2 remains under poly 3 and the photoresist. Since $T_{OX} - \Delta T_{OX} > X_{STI} + \Delta X_{STI}$, poly 1 is not completely removed from the active region, as shown in FIG. 8, which is a cross-sectional view of the device structure shown in FIG. 7 rotated ninety degrees to show the cross-section along the source/channel/drain of a transistor. The thickness of the remaining poly 1 should be independent of the CMP process.

After the second polysilicon layer 40 has been removed, a highly selective etch is used to etch the remaining portion of the first polysilicon layer 16 that is not covered by photoresist. By stopping at the bottom of poly 2 and leaving a thin layer of poly 1 over the gate insulator 12 and then performing a highly selective etch to remove the remaining thin layer of poly 1, micro-trenching may be reduced, or eliminated. By using high selectivity plasma etching, the remainder of poly 1 can be selectively removed without excessive removal of gate insulator 12 in the source and drain region.

Figure 9:
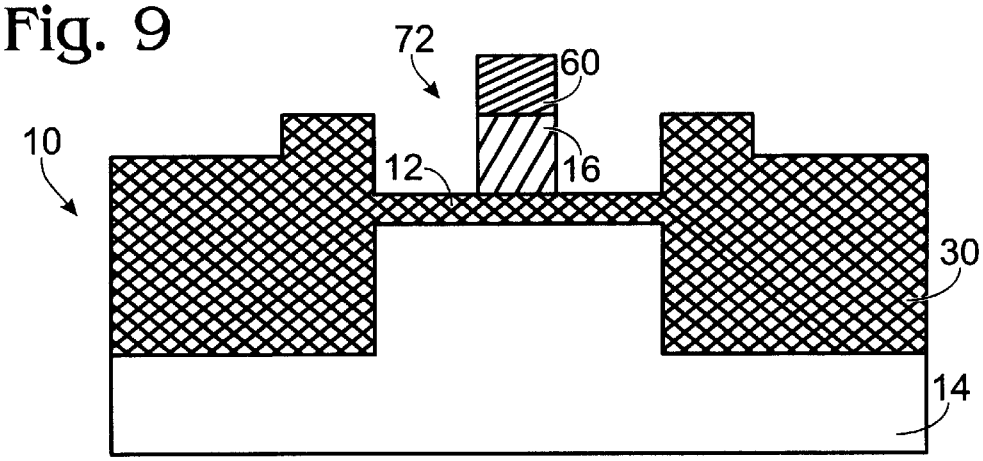
FIG. 9 is cross section view of a device structure showing the source, channel, and drain regions.

The photoresist is then stripped leaving the polysilicon gate stack 72 that comprises the remaining portions of poly 1 and poly 3 over each active area, as shown in FIG. 9. Some poly 2 remains under the portion of poly 3 extending beyond the active region, which is not visible in FIG. 9.

After formation of the gate structure, ion implantation may be used to form source and drain regions that are self-aligned to the gate structure. Poly 1, poly 2, and poly 3 are also converted to n+ or p+ polysilicon as is common in conventional processes. The polysilicon gate structure may alternatively be doped prior to the gate electrode etch, and prior to the source and drain ion implant. The polysilicon gate may also be salicided. Several methods of polysilicon gate doping, silicide or self aligned processes, including salicide processes, may be applied to the present process.

Figure 10:
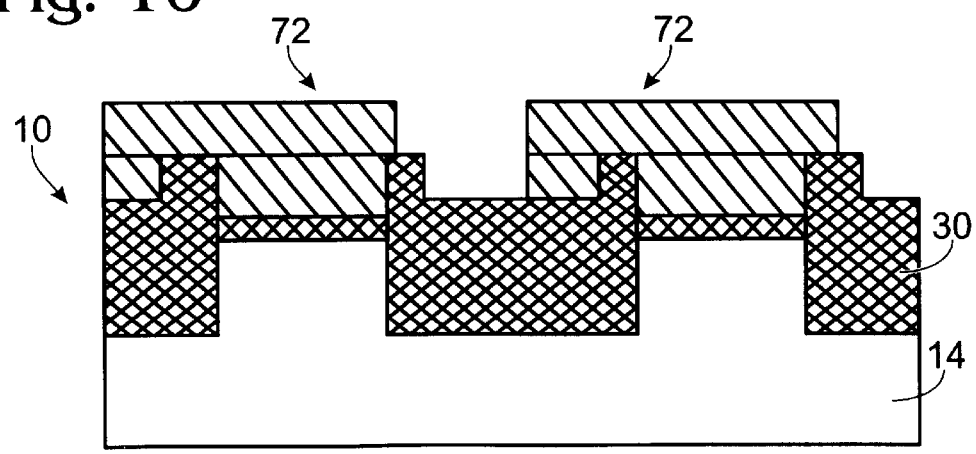
FIG. 10 is cross section view of a device structure during processing.
Figure 11:
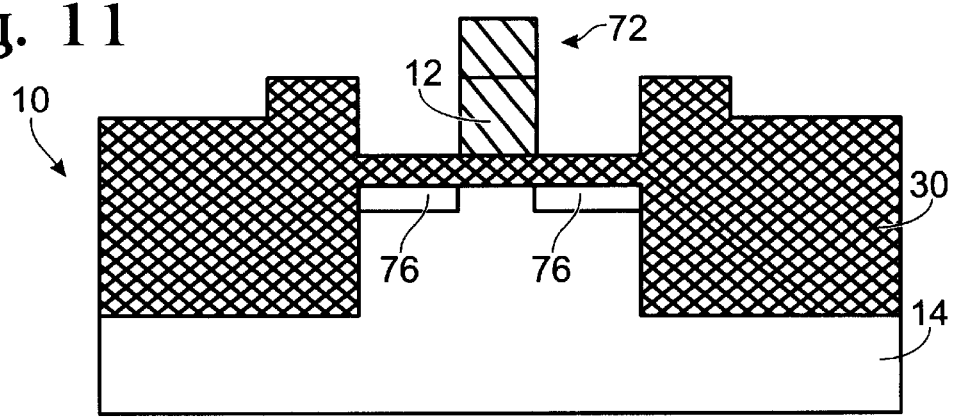
FIG. 11 is cross section view of a device structure as in FIG. 10, but rotated ninety degrees to show the source, channel, and drain regions.

The polysilicon gate structure 72 following doping is shown in FIG. 10 and FIG. 11, which also shows the implanted source and drain regions 76.

Some embodiments of the present invention may exhibit some, or all, of the advantages of modified STI processes, such as negligible narrow channel effects, high gate insulator integrity, uniform threshold voltage across the transistor, and low field leakage current.

Figure 12:
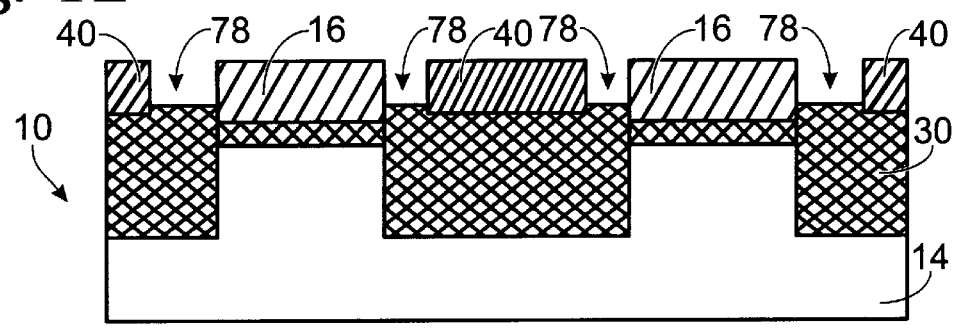
FIG. 12 is cross section view of a device structure during formation of alignment features.

In an additional embodiment, an alignment key is incorporated into the modified STI process described above without the need for an additional photoresist and masking step. Referring now to FIG. 12 which corresponds to the device structure after an additional etch step is performed after the process leading up to FIG. 5 above. After the CMP step discussed above, an oxide etch is used to remove a portion of the oxide layer 30. A plasma etch or a wet etch solution containing HF may be used to etch the oxide. In the example embodiment shown, the oxide is etched to remove approximately 100 nanometers of oxide forming notches 78.

Figure 13:
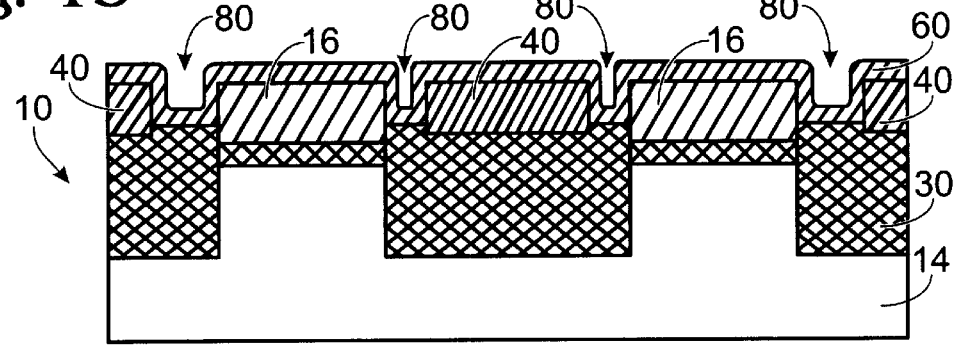
FIG. 13 is cross section view of a device structure during formation of alignment features.

Following the oxide etch, the polysilicon layer 60 may be deposited as shown in FIG. 13. The polysilicon layer shown corresponds to poly 3 as discussed above, such that FIG. 13 corresponds to FIG. 6 at that step in the processes, but with the addition of the alignment keys 80. The process can then be completed as described above to form a final gate structure. The alignment keys are now available for subsequent lithography alignment needs.

Figure 14:
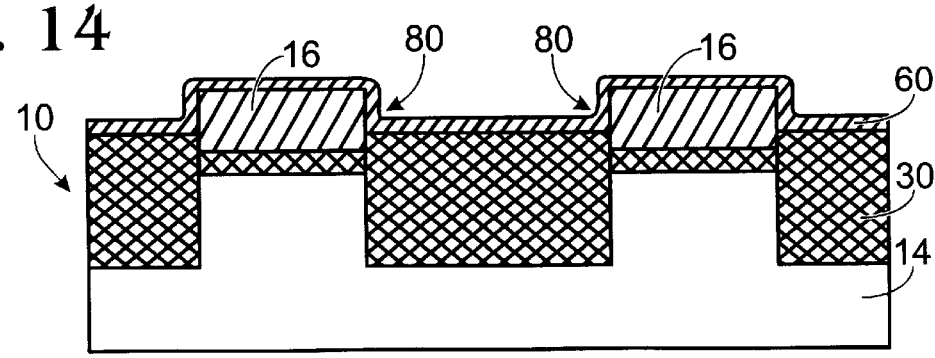
FIG. 14 is cross section view of a device structure during formation of alignment features.

In another embodiment, alignment keys can be incorporated into a single poly STI structure using a modified STI process without poly 2. The resulting structure with edges that serve as alignment keys 80 is shown in FIG. 14. The alignment keys were formed by etching the oxide following CMP. After etching another polysilicon layer corresponding to poly 3 is deposited. But in this case, there was no poly 2 used in the process. Subsequent processing may be used to complete the device structure to form a transistor with a gate, and source and drain regions.

Although exemplary embodiments, including possible variations have been described, the scope of the present invention shall not be limited to these examples, but rather are to be determined by the following claims.

What is claimed is:

1. A method of making self-aligned shallow trench isolation comprising the steps of:
   a) forming a first polysilicon layer, which has a bottom surface and a top surface, overlying a substrate with a gate insulator layer interposed between the substrate and the first polysilicon layer;
   b) forming a trench through the first polysilicon layer, and into the substrate;
   c) forming a field oxide layer, having an upper surface, overlying the substrate to a thickness such that the upper surface of the field oxide layer within the trench is higher than the bottom surface of the first polysilicon layer;
   d) depositing a second polysilicon layer, having an upper surface, overlying the insulating layer to a thickness such that the upper surface of the second polysilicon layer within the trench is lower than the top surface of the first polysilicon layer;
   e) depositing a sacrificial oxide layer over the second polysilicon layer;
   f) planarizing the second polysilicon layer, the field oxide layer, and the first polysilicon layer; and
   g) stopping the step of planarizing at the upper surface of the second polysilicon layer.

2. The method of claim 1, wherein the field oxide layer is formed by growing a thin thermal oxide and then depositing the remainder of the oxide using a CVD process, or sputtering.

3. The method of claim 1, wherein the gate insulator layer is silicon dioxide.

4. The method of claim 1, wherein the gate insulator layer comprises silicon oxide, silicon oxynitride, hafnium oxide, zirconium oxide or lanthanum oxide.

5. The method of claim 1, wherein the first polysilicon layer is replaced by sacrificial gate material overlying the gate insulator layer, whereby the gate insulator layer is interposed between the sacrificial gate material and the substrate.

6. The method of claim 3, further comprising the steps of:
   a) depositing a third polysilicon layer;
   b) depositing and patterning photoresist to define a gate structure;
   c) selectively etching the third polysilicon layer, the second polysilicon layer, and the first polysilicon layer; and
   d) stopping after the removal of exposed regions of the second polysilicon layer, whereby a thin layer of exposed first polysilicon layer remains.

7. The method of claim 6, further comprising the step of selectively etching the remaining exposed first polysilicon layer using a highly selective etch, whereby the remaining exposed first polysilicon layer is removed without excess removal of the underlying gate insulator layer.

8. The method of claim 1, further comprising the step of etching the field oxide layer using an oxide selective etch, whereby an alignment key is formed.

9. A method of forming alignment keys in a modified shallow trench isolation process comprising the steps of:
   a) forming a modified STI structure comprising an oxide filled trench and at least one polysilicon layer; and
   b) selectively etching the oxide following CMP processing to form an alignment key in the oxide.

10. The method of claim 9, wherein the oxide filling the trench is etched to remove approximately 100 nanometers of oxide.

11. The method of claim 9, further comprising the step of depositing a second polysilicon layer during the formation of the modified STI structure.

12. A method of making self-aligned shallow trench isolation comprising the steps of:
   a) forming a first polysilicon layer, which has a bottom surface and a top surface, overlying a substrate with a gate insulator layer interposed between the substrate and the first polysilicon layer;
   b) forming a trench through the first polysilicon layer, and into the substrate;
   c) forming a field oxide layer, having an upper surface, overlying the substrate to a thickness such that the upper surface of the field oxide layer within the trench is higher than the bottom surface of the first polysilicon layer;
   d) depositing a second polysilicon layer, having an upper surface, overlying the insulating layer to a thickness such that the upper surface of the second polysilicon layer within the trench is lower than the top surface of the first polysilicon layer;
   e) depositing a sacrificial oxide layer over the second polysilicon layer;
   f) planarizing the second polysilicon layer, the oxide layer, and the first polysilicon layer;

g) stopping the step of planarizing at the upper surface of the second polysilicon layer;

h) selectively etching the oxide to form an alignment key in the oxide;

i) depositing a third polysilicon layer;

j) depositing and patterning photoresist to define a gate structure;

k) selectively etching the third polysilicon layer, the second polysilicon layer, and the first polysilicon layer; and l) stopping after the removal of exposed regions of the second polysilicon layer, whereby a thin layer of exposed first polysilicon layer remains.

* * * * *